(12) United States Patent
Loh et al.

(10) Patent No.: US 7,595,120 B2
(45) Date of Patent: Sep. 29, 2009

(54) CERAMIC COMPOSITE

(75) Inventors: Ih-Houng Loh, Lexington, MA (US); Geoffrey Wen-Tai Shuy, Shan (HK)

(73) Assignee: AST Products, Inc., Billerica, MA (US)

( * ) Notice: Subject to any disclaimer, the term of this patent is extended or adjusted under 35 U.S.C. 154(b) by 0 days.

(21) Appl. No.: 12/048,460

(22) Filed: Mar. 14, 2008

(65) Prior Publication Data

US 2008/0176732 A1  Jul. 24, 2008

Related U.S. Application Data

(62) Division of application No. 10/828,154, filed on Apr. 20, 2004, now Pat. No. 7,378,163.

(51) Int. Cl.
*B32B 9/00* (2006.01)
(52) U.S. Cl. .................. 428/701; 428/702; 428/698
(58) Field of Classification Search .............. None
See application file for complete search history.

(56) References Cited

U.S. PATENT DOCUMENTS

| 3,966,999 A | 6/1976 | Horiguchi |
| 3,996,884 A | 12/1976 | Horiguchi |
| 4,631,269 A * | 12/1986 | Lachman et al. ............ 502/439 |
| 4,632,846 A | 12/1986 | Fuijnaka et al. |
| 4,684,916 A | 8/1987 | Ozawa |
| 4,714,570 A | 12/1987 | Nakatani et al. |
| 6,667,072 B2 | 12/2003 | Shuy et al. |

* cited by examiner

*Primary Examiner*—Timothy M Speer
(74) *Attorney, Agent, or Firm*—Occhiuti Rohlicek & Tsao LLP

(57) ABSTRACT

A ceramic composition including a first ceramic material and a second ceramic material that is in the form of nano-, sub-micron-, or micron-sized particles, in which the first ceramic material has a lower melting point than the second ceramic material, and, when the first ceramic material melts into a liquid and the second ceramic material remains particulate, the second ceramic material floats at the top of the liquid. Also disclosed is a variant of this composition including a first ceramic material and a second ceramic material, in which the second ceramic material has a melting point higher than the first ceramic material, and, when the first ceramic material melts into a liquid, the second ceramic material partially or completely dissolves in the liquid.

9 Claims, 1 Drawing Sheet

CERAMIC COMPOSITE

CROSS-REFERENCE TO RELATED APPLICATIONS

This application is a divisional application of U.S. patent application Ser. No. 10/828,154, filed on Apr. 20, 2004. The contents of which is hereby incorporated by reference in its entirety.

BACKGROUND

Thin film technology involves forming thin films on substrates widely used in semiconductors and chip resistors. Desirable substrates have the following characteristics: (1) low dielectric loss, (2) high electrical insulation, (3) high thermal conductivity, (4) low surface roughness, (5) strong adhesion for thin films, (6) low water absorption, (7) high glass transition temperature, (8) great mechanical strength, (9) high thermal shock resistance, (10) low material diffusion, and (11) low costs.

Highly sintered ceramic substrates (such as those containing more than 99% aluminum oxide, titanium oxide, zirconium oxide, aluminum nitride, titanium nitride, and zirconium nitride) are commonly used in thin film technology. Theses substrates have most of the characteristics listed above. However, the fabrication cost is high as polishing is required.

SUMMARY

The present invention relates to forming a ceramic composite by solidifying a layer of a liquid of a ceramic material on the top of a ceramic substrate. As the liquid has a smooth surface, the solidified layer formed from it also has a smooth surface and does not need polishing.

An aspect of the present invention is a ceramic composite that has (1) a ceramic substrate; (2) a ceramic layer; and (3) a multiplicity of ceramic stalagmites, or a multiplicity of ceramic stalactites, or a multiplicity of ceramic stalagmites and ceramic stalactites, or a multiplicity of ceramic stalagmites, ceramic stalactites and ceramic granules. The ceramic layer is disposed on the top surface of the substrate, and the stalagmites and stalactites are embedded in the ceramic layer. The stalagmites extend upward from the top surface of the substrate, the stalactites extend downward from the top surface of the ceramic layer, and the granules are dispersed throughout the ceramic layer. The ceramic composite can further contain a multiplicity of ceramic columns, or a multiplicity of ceramic spikes, or both. The columns are also embedded in the ceramic layer and extend between the top surface of the ceramic layer and the top surface of the substrate in the composite. The spikes protrude upward from the top surface of the ceramic layer. The stalagmites, stalactites, granules, and columns each have the size of nanometers or microns, and the spikes each have the size of nanometers. The ceramic substrate has a higher melting point than the ceramic layer. In certain embodiments, the ceramic substrate also has a higher thermal conductivity.

Another aspect of this invention is a composition for use in making a ceramic composite. The composition contains a first ceramic material and at least one of two other ceramic materials, i.e., second and third ceramic materials. The second ceramic material is in the form of nano, submicron, micron-sized particles and has a higher melting point than the first ceramic material. When the first ceramic material melts into a liquid and the second ceramic material remains particulate, the second ceramic material floats at the top of the liquid. The third ceramic material has a higher melting point than the first ceramic material. When the first ceramic material melts into a liquid, the third ceramic material partially or completely dissolve in it.

Still another aspect of the present invention is a method for making a ceramic composite. In one embodiment, the method includes (1) applying a composition containing a first ceramic material and a second ceramic material onto the top surface of a ceramic substrate, in which the first ceramic material has a lower melting point than the second ceramic material and the substrate, and the second ceramic material is in the form of nano-, submicron-, or micron-sized particles; (2) heating the substrate to a temperature where the first ceramic material melts into a liquid, the second ceramic material remains particulate and floats to the top of the liquid, and the substrate remains solid; and (3) slowly or rapidly cooling the substrate to form a ceramic composite. In this embodiment, the composition may further contain a third ceramic material, which has a higher melting point than the first ceramic material and, when the first ceramic material melts into a liquid, the third ceramic material partially or completely dissolves in the liquid. In another embodiment, the method includes (1) applying a composition containing a first ceramic material onto the top surface of a ceramic substrate, in which the ceramic material in the composition has a lower melting point than the substrate; (2) heating the substrate to a temperature where the ceramic material in the composition melts and the substrate remains solid; and (3) slowly or rapidly cooling the substrate to form a ceramic composite. In this embodiment, the composition may further contain a third ceramic material. The third ceramic material has a higher melting point than the first ceramic material and, when the first ceramic material melts into a liquid, the third ceramic material partially or completely dissolves in it.

Other features and advantages of the invention will be apparent from the following description of the preferred embodiments thereof, and from the claims.

DETAILED DESCRIPTION

Figure 1:
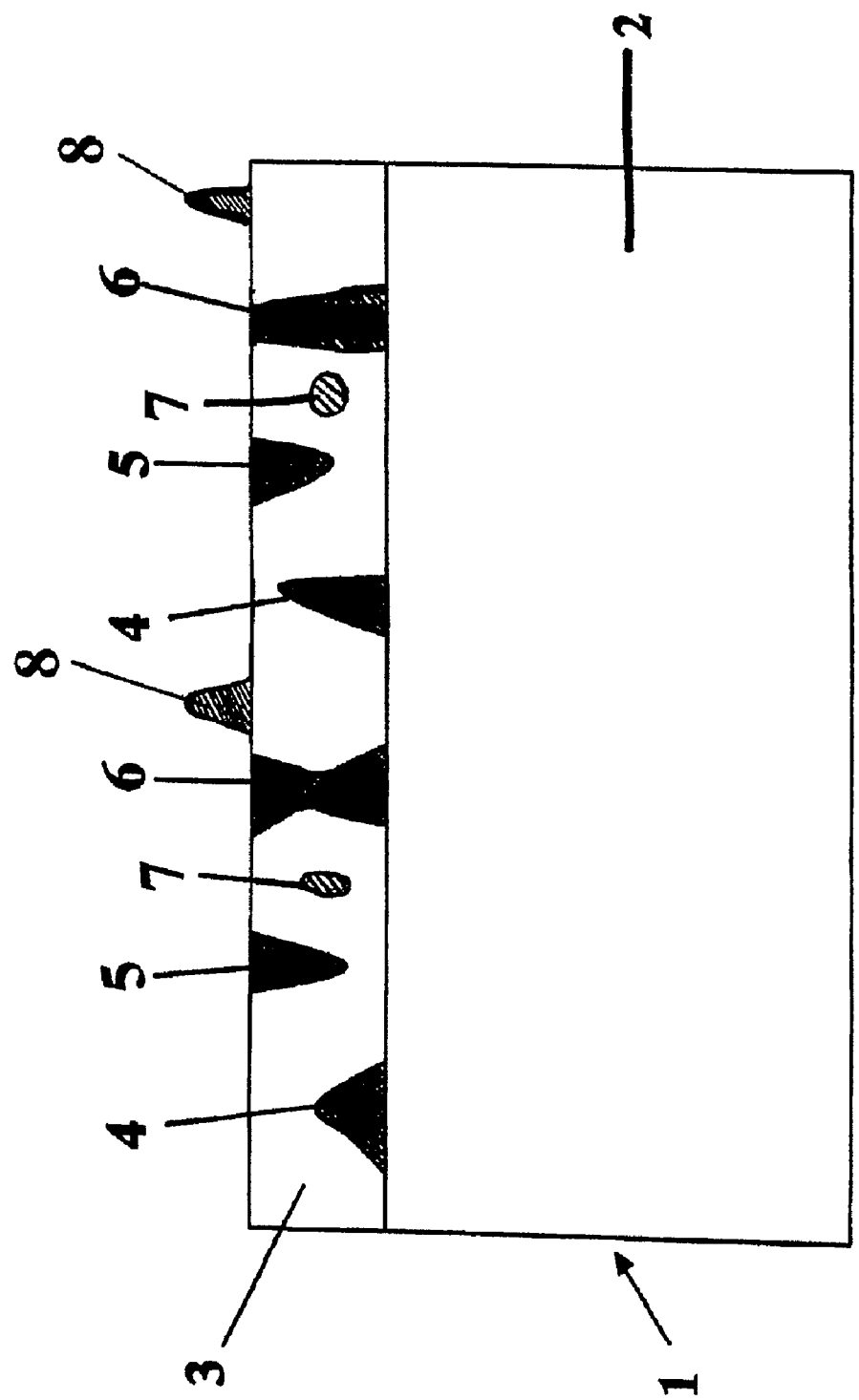
FIG. 1 shows a schematic illustration of a ceramic composite of this invention.

Illustrated in FIG. 1 is a ceramic composite 1 of this invention. The composite 1 includes a ceramic substrate 2, a ceramic layer 3, a multiplicity of nano-sized or micron-sized ceramic stalagmites 4, a multiplicity of nano-sized or micron-sized ceramic stalactites 5, and a multiplicity of nano-sized or micron-sized ceramic columns 6. The ceramic layer 3 is disposed on the top surface of the substrate 2. Embedded in the ceramic layer 3 are the stalagmites 4, stalactites 5, and columns 6. The stalagmites 4 extend upward from the top surface of the substrate 2, the stalactites 5 extend downward from the top surface of the ceramic layer 3, and the columns 6 extend between the top surface of the ceramic layer 3 and the top surface of the substrate 2. For simplicity, only two stalagmites, two stalactites, and two columns are shown in FIG. 1.

To make the above ceramic composite, a coating composition containing two ceramic materials (referred to in this specification as "a first ceramic material" and "a second ceramic material") is first applied onto the top surface of a ceramic substrate as a film with a desired thickness (e.g., 1 micron or greater). The ceramic substrate is made of a ceramic material, such as, $Al_2O_3$, $TiO_2$, $ZrO_2$, aluminum nitride, titanium nitride, zirconium nitride, or a mixture thereof. The first ceramic material has a lower melting point than the second ceramic material and the substrate. A melting point refers to a specific temperature, or a temperature range at the lower end of which a ceramic material starts to melt and at the upper end of which the ceramic material completely melts. The first ceramic material (i.e., in either solid form or liquid form) preferably has a lower thermal conductivity than the second ceramic material and the substrate material. Examples of the first ceramic material include, but are not limited to, silica powder, glass powder, glaze powder, copper oxide, lead oxide, hafnium oxide, boron oxide, or a mixture thereof. Other substances can also be included in the first ceramic material in order to modify certain properties or introduce useful properties. The second ceramic material is in the form of nano-, submicron-, or micron-sized particles. Examples of the second ceramic material include, but are not limited to, $Al_2O_3$, $TiO_2$, $ZrO_2$, aluminum nitride, titanium nitride, zirconium nitride, or a mixture thereof.

The coating composition is preferably a paste so that it can be conveniently applied onto the top surface of the substrate. The paste is prepared by mixing an organic binder with the first and second ceramic materials. Examples of an organic binder include animal oil, corn oil, or a mixture thereof. The paste can be applied onto the substrate by printing or spinning coating. Other suitable means can also be used to coat the substrate with the paste.

The coated substrate is then heated to a temperature, at which the first ceramic material melts into a liquid and both the substrate material and the second ceramic material do not melt or only melt negligibly at most. In this embodiment, the liquid dissolves some substrate material, or part of the second ceramic material, or both. The second ceramic material remains particulate and floats to the top of the liquid.

Finally, the coated substrate is cooled slowly. That is, the temperature of the substrate is lowered over an extended period so that the liquid containing the dissolved material or materials do not become over-saturated. Slow cooling can be controlled so as to follow a predetermined temperature-time curve. In the slow cooling process, the temperature of the substrate decreases faster than that of the first ceramic material when the substrate has a higher thermal conductivity. As a result, a temperature gradient is generated between the top surface of the liquid and the top surface of the substrate. This temperature gradient facilitates deposition of the material or materials dissolved in the liquid on naturally occurring nano-, submicron-, or micron-sized tips on the top surface of the substrate and on floating particles made of the second ceramic material. More specifically, the tips and the floating particles serve as nucleation centers. The dissolved material or materials crystallize and accumulate on the tips to form stalagmites extending upward from the top surface of the substrate, and crystallize and accumulate on the underside of floating particles to form stalactites extending downward from the top surface of the liquid. Some stalagmites and some stalactites may grow to the full extent, thereby forming columns spanning between the top surface of the liquid and the top surface of the substrate. Columns are also formed when growing stalagmites and growing stalactites contact each other. As the temperature further decreases, the liquid solidifies and a ceramic composite is formed having a ceramic layer in which stalagmites, stalactites, and columns are embedded. While the stalagmites, stalactites, and columns each are mostly formed from the dissolved material or materials in the liquid, they may also contain a trace amount of the first ceramic material. The ceramic layer mainly contains the first ceramic material, although it may also contain a trace amount of the substrate material or the second ceramic material.

Alternatively, a coating composition containing at least a first ceramic material (described above) and a third ceramic material is used to make the above ceramic composite. The third ceramic material has a higher melting point than the first ceramic material and has a density of one's choice. When the first ceramic material melts into a liquid, the third ceramic material partially or completely dissolves in the liquid. Examples of the third ceramic material include, but are not limited to, a SiC substrate, a ceramic tile, $Al_2O_3$, $TiO_2$, $ZrO_2$, aluminum nitride, titanium nitride, zirconium nitride, and a mixture thereof. After a substrate is coated with such a composition, the coated substrate is heated to melt the first ceramic material into a liquid. When the third ceramic material has a density close to that of the liquid molten from the first ceramic material, undissolved third ceramic material floats at both the top and the bottom of the liquid. When the substrate has a higher thermal conductivity than the first ceramic material, a temperature gradient is generated within the liquid during the heating process. More specifically, as the first ceramic material is heated up slower than the substrate, the temperature at the top of the liquid is the lowest and that at the bottom of the liquid is the highest. Dissolved third ceramic material solidifies as particles near the surface of the liquid, where the temperature is lower. Upon slow cooling, as the substrate is cooled down faster, a reversed temperature gradient is generated, i.e., the temperature at the bottom of the liquid is the lowest and that at the top of the liquid is the highest. The dissolved third ceramic material solidifies as particles near the surface of the substrate. All of these particles and any undissolved third ceramic material serve as nucleation centers. The dissolved third ceramic material solidifies at the nucleation centers to form stalactites, stalagmites, and columns. In this embodiment, the substrate material may or may not dissolve in the liquid.

Other ceramic composites of this invention can be made in a similar manner. For example, when a coating composition containing only a first ceramic material and a tip-containing substrate are used, after coating, heating, and slow cooling processes, a ceramic composite is formed having a layer in which a multiplicity of nano- or micron-sized stalagmites and, possibly also columns and stalactites, are embedded. In this embodiment, it is essential that the liquid molten from the first ceramic material dissolve part of the substrate so that stalagmites, or even columns, can be formed from the dissolved material. Note that stalactites form only when there are particles floating at the top of the liquid to function as nucleation centers. This can be achieved as follows: when the substrate has a higher thermal conductivity, a temperature gradient is generated during the slow cooling process, i.e., the temperature at the bottom of the liquid is the lowest and that at the top of the liquid is the highest. Particles at the bottom of the liquid where the temperature is lower, float to the top of the liquid (if the substrate material has a lower density than the first ceramic material), and serve as nucleation centers for forming stalactites. As another example, when a coating composition containing the above-described first and second ceramic materials and a tip-free substrate are used, stalagmites do not form for lack of nucleation centers on the surface of the substrate. As a result, the ceramic composite has a ceramic layer in which only stalactites, or stalactites and columns are embedded.

Note that formation of columns depends on the amount of the dissolved material or materials in the liquid. When the amount is small, stalagmites and stalactites do not grow long enough for some of them to contact each other to form columns. As a result, the composite only contains stalagmites, stalactites, or both. To lower the amount of the dissolved material or materials in the liquid, one can (1) increase the content of the first ceramic material and decrease the content of the second or third ceramic material in the coating composition, (2) select the second and third ceramic materials and the substrate material that have low solubility in the liquid formed of the first ceramic material, or (3) reduce heating time.

When any of the above-mentioned ceramic compositions is applied to a ceramic substrate, heated, and rapidly cooled, a ceramic composite is formed having a layer in which granules (see 7 in FIG. 1), in addition to stalagmites and stalactites, are embedded. The granules are dispersed throughout the ceramic layer. In a rapid cooling process, the substrate and the liquid molten from the first ceramic material in the composition are cooled down over a relatively short period of time so that the liquid is over-saturated. After heating a coated substrate in an oven, rapid cooling can be achieved by opening the oven door or introducing a cold air stream into the oven. When the temperature rapidly decreases to a certain point, the liquid becomes over-saturated and the dissolved ceramic material or materials solidify throughout the liquid to form nano-sized or micron-sized stalactites, stalagmites, and granules. Some granules may merge with stalagmites, or stalactites, or both to form columns. Columns may also form in the same manner as in the slow cooling process described above.

A ceramic composite of this invention may further include additional features. For example, it may have a multiplicity of nano-sized spikes (See 8 in FIG. 1) on the top surface of the ceramic layer. These spikes are generated during the cooling process. More specifically, when the temperature decreases, a trace of the dissolved materials crystallizes and accumulates on the surface of the liquid, thereby forming nano-sized spikes protruding from the top surface of the ceramic layer. These spikes can be observed by atomic force micrometer (AFM), but not by conventional roughness devices. They can serve as pinning centers for a film coated on the top surface of the ceramic layer. As a result, the film has strong adhesion to the composite and also has high resistance to thermal shock. Note that a smooth surface may have a low density (less than 5% in the area ratio) of spikes all of which are $\leq 50$ nm in height and $\leq 10$ nm in diameters. In other word, the top surface of the ceramic layer is smooth, even when a multiplicity of nano-sized spikes extend upward from it.

The four examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLE 1

A paste was prepared by blending an organic binder (i.e., a mixture of animal oil and corn oil) with micro/nano-sized powders. The powders were composed of 95% by weight silica powder, 3% by weight $Al_2O_3$ powder (melting point>2000° C.), 0.5% by weight copper oxide powder, 0.5% by weight lead oxide powder, 0.5% by weight hafnium oxide powder, and 0.5% by weight boron oxide powder. The paste was applied as a 75 micron-thick film onto the top of a substrate made of 96% sintered $Al_2O_3$. The coated substrate was heated at 1100° C. for 5 hours to melt all components except $Al_2O_3$ in the coated film into a liquid. The $Al_2O_3$ particles remained particulate and floated to the top of the liquid. After slowly cooling down to room temperature in about 10 hours, a ceramic composite was formed.

Scanning electron microscope analysis shows that the composite had a layer on the top of the substrate. Embedded in the layer were millions of micro/nano stalactites per square centimeter extending downward from the top surface of the layer, millions of micro/nano stalagmites per square centimeter extending upward from the top surface of the substrate, and thousands of micro/nano columns per square centimeter extending between the top surface of the layer and the top surface of the substrate.

The surface of the ceramic composite was studied by atomic force microscope (AFM) imaging analysis. The AFM image shows that there were a matrix of thousands of spikes per square centimeter extending upward from the top surface of the composite. The spikes had diameters in nanometers and heights in tens of nanometers.

The surface roughness of the composite was measured with an Alpha Step profilometer (Tencor) or a DEKTAK 3ST profilometer (Veeco Instrument Inc.). The results show that the surface was as smooth as the surface of a polished silicon substrate for integrated circuit (IC) application.

The ceramic composite was then sputtered with a 2-micrometer thick aluminum film. A peeling test shows that the adhesion of this film was unexpectedly more than twice as strong as that of a film deposited on the surface of a silicon IC substrate. Also unexpectedly, a thermal shock test shows that the aluminum film withstood a 550° C. to room temperature shock more than 3 times as well as an aluminum film deposited on the surface of a silicon IC substrate.

A band pass filter for 30 Gaga Hz RF application was fabricated using the ceramic composite. The band pass unexpectedly transmitted 15% to 30% more power and resulted in 5% less noise than a band pass filter fabricated using a 99.6% alumna substrate.

The thermal conductivity of the ceramic composite was measured. Unexpectedly, it was up to 80% of the thermal conductivity of the base substrate made of 96% sintered alumna material.

EXAMPLE 2

A paste, prepared according to the method described in Example 1, was applied as a 75 micron-thick film onto the top of a substrate made of 96% sintered $Al_2O_3$. The coated substrate was heated at 1100° C. for 5 hours to melt all components except $Al_2O_3$ in the coated film into a liquid. The $Al_2O_3$ particles remained particulate and floated to the top of the liquid. The coated substrate was slowly cooled from 1100° C. to 900° C. in about 1 hour and then rapidly cooled from 900° C. to 50° C. in less than 2 hours. A ceramic composite was formed.

Scanning electron microscope analysis shows that the composite had a layer on the top of the substrate. Embedded in the layer were millions of micro/nano stalactites per square centimeter extending downward from the top surface of the layer, millions of micro/nano stalagmites per square centimeter extending upward from the top surface of the substrate, millions of micro/nano granules per square centimeter dispersed throughout the layer, and thousands of micro/nano columns per square centimeter extending between the top surface of the layer and the top surface of the substrate.

The surface morphology and physical properties of the composite were also examined and were found to be similar to those of the composite formed in Example 1.

EXAMPLE 3

A paste was prepared by blending an organic binder (i.e., a mixture of animal oil and corn oil) with micro/nano grainsized powders. The powders were composed of 96.3% by weight silica powder, 0.7% by weight copper oxide powder, 0.5% by weight lead oxide powder, 1% by weight hafnium oxide powder, and 1.5% by weight boron oxide powder. The paste was applied as a 75 micron-thick film onto the top of a substrate made of 96% sintered $Al_2O_3$. The substrate was heated at 1100° C. for 5 hours to melt the applied paste into a liquid. After slowly cooling down to room temperature in about 10 hours, a ceramic composite was formed.

Transmission electron microscopy analysis shows that the composite had a layer on the top of the substrate. Embedded in the layer were tens to hundreds of thousands of micro/nano stalactites per square centimeter extending downward from the top surface of the layer, millions of micro/nano stalagmites per square centimeter extending upward from the top surface of the substrate, and thousands of micro/nano columns per square centimeter extending between the top surface of the layer and the top surface of the substrate.

The surface of the ceramic composite was studied by AFM imaging analysis. The AFM image shows that there were a matrix of thousands of spikes per square centimeter extending upward from the top surface of the composite. The spikes had diameters in nanometers and heights in tens of nanometers.

Surface roughness of the composite was measured with an Alpha Step profilometer (Tencor) or a DEKTAK 3ST profilometer (Veeco Instrument Inc.). The results show that the surface was as smooth as the surface of a polished silicon substrate for IC application.

The ceramic composite was then sputtered with a 2-micrometer thick aluminum film. A peeling test shows that the adhesion of this film was unexpectedly more than twice as strong as that of a film deposited on the surface of an IC Silicon substrate. Also unexpectedly, a thermal shock test shows that the aluminum film unexpectedly withstood of a 550° C. to room temperature shock more than 3 times as well as an aluminium film deposited on the surface of an IC Silicon substrate.

A band pass filter for 30 Gaga Hz RF application was fabricated using the ceramic composite. The band pass filter unexpectedly transmitted 5% to 10% more power and resulted in 2% less noise than a band pass filter fabricated using a 99.6% alumna substrate.

The thermal conductivity of the ceramic composite was measured. Unexpectedly, it was up to 50% of the thermal conductivity of the base substrate which 96% sintered alumna material.

EXAMPLE 4

A paste, prepared according the method described in Example 3, was applied as a 75 micron-thick film onto the top of a substrate made of 96% sintered $Al_2O_3$. The coated substrate was heated at 1100° C. for 5 hours to melt the applied paste into a liquid. It was then slowly cooled from 1100° C. down to 900° C. in about 1 hour followed by rapid cooling from 900° C. to 50° C. in less than 2 hours. A ceramic composite was formed.

Scanning electron microscope analysis shows that the composite had a layer on the top of the substrate. Embedded in the layer were millions of micro/nano stalactites per square centimeter extending downward from the top surface of the layer, millions of micro/nano stalagmites per square centimeter extending upward from the top surface of the substrate, millions of micro/nano granules per square centimeter dispersed throughout the layer, and thousands of micro/nano columns per square centimeter extending between the top surface of the layer and the top surface of the substrate.

The surface morphology and physical properties of the composite were also examined and were found to be similar to those of the composite formed in Example 3.

OTHER EMBODIMENTS

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims

What is claimed is:

1. A ceramic composition, comprising:
   an organic binder,
   a first ceramic material, wherein the first ceramic material is silica powder, glass powder, glaze powder, copper oxide, lead oxide, hafnium oxide, boron oxide, or a mixture thereof, and
   a second ceramic material in the form of nano-, submicron-, or micron-sized particles, wherein the second ceramic material is aluminum oxide, titanium oxide, zirconium oxide, aluminum nitride, titanium nitride, zirconium nitride, or a mixture thereof,
   a third ceramic material, wherein the third ceramic material has a higher melting point than the first ceramic material, and, when the first ceramic material melts into a liquid, the third ceramic material partially or completely dissolves in the liquid,
   wherein the first ceramic material has a lower melting point than the second ceramic material, and, when the first ceramic material melts into a liquid and the second ceramic material remains particulate, the second ceramic material floats at the top of the liquid.

2. The ceramic composition of claim 1, wherein the first ceramic material is silica powder, glass powder, glaze powder, copper oxide, lead oxide, or a mixture thereof.

3. The ceramic composition of claim 2, wherein the first ceramic material is silica powder.

4. The ceramic composition of claim 1, wherein the second ceramic material is aluminum oxide, titanium oxide, zirconium oxide, aluminum nitride, or a mixture thereof.

5. The ceramic composition of claim 4, wherein the second ceramic material is aluminum oxide.

6. The ceramic composition of claim 1, wherein the third ceramic material is a SiC substrate, ceramic tiles, aluminum oxide, titanium oxide, zirconium oxide, aluminum nitride, titanium nitride, zirconium nitride, or a mixture thereof.

7. The ceramic composition of claim 6, wherein the third ceramic material is a SiC substrate, ceramic tiles, aluminum oxide, titanium oxide, zirconium oxide, aluminum nitride, or a mixture thereof.

8. The ceramic composition of claim 7, wherein the third ceramic material is a SiC substrate.

9. A ceramic composition, comprising
   an organic binder,
   a first ceramic material, and
   a second ceramic material,
   wherein the second ceramic material has a melting point higher than the first ceramic material, and, when the first ceramic material melts into a liquid, the second ceramic material partially or completely dissolves in the liquid, and
   wherein the first material contains silica powder and the second ceramic material contains a SiC substrate.

* * * * *